(12) United States Patent
Pinto et al.

(10) Patent No.: US 7,164,186 B2
(45) Date of Patent: Jan. 16, 2007

(54) STRUCTURE OF SEMICONDUCTOR DEVICE WITH SINKER CONTACT REGION

(75) Inventors: Angelo Pinto, Allen, TX (US); Jeffrey A. Babcock, Richardson, TX (US); Michael Schober, Freising (DE); Scott G. Balster, Munich (DE); Christoph Dirnecker, Haag a.d. Amper (DE)

(73) Assignee: Texas Instruments Incorporated, Dallas, TX (US)

( * ) Notice: Subject to any disclaimer, the term of this patent is extended or adjusted under 35 U.S.C. 154(b) by 152 days.

(21) Appl. No.: 10/939,221

(22) Filed: Sep. 10, 2004

(65) Prior Publication Data

US 2005/0037588 A1 Feb. 17, 2005

Related U.S. Application Data

(62) Division of application No. 10/262,211, filed on Sep. 30, 2002, now Pat. No. 6,806,159.

(51) Int. Cl.
*H01L 29/70* (2006.01)

(52) U.S. Cl. ............... 257/586; 257/378; 257/E27.053

(58) Field of Classification Search ............... 257/378, 257/586–587, E27.053, E27.057
See application file for complete search history.

(56) References Cited

U.S. PATENT DOCUMENTS

| | | | | |
|---|---|---|---|---|
| 4,835,580 A | * | 5/1989 | Havemann et al. ......... 257/478 |
| 5,003,365 A | * | 3/1991 | Havemann et al. ......... 257/514 |
| 5,061,646 A | * | 10/1991 | Sivan et al. ................. 438/363 |
| 5,457,068 A | * | 10/1995 | Malhi et al. ................. 438/128 |
| 5,547,893 A | * | 8/1996 | Sung ........................... 438/207 |
| 6,066,520 A | * | 5/2000 | Suzuki ........................ 438/202 |

* cited by examiner

*Primary Examiner*—N. Drew Richards
(74) *Attorney, Agent, or Firm*—Yingsheng Tung; Wade James Brady, III; Frederick J. Telecky, Jr.

(57) ABSTRACT

A method for manufacturing a semiconductor device includes forming a buried layer of a semiconductor substrate. An active region is formed adjacent at least a portion of the buried layer. A first isolation structure is formed adjacent at least a portion of the buried layer. A second isolation structure is formed adjacent at least a portion of the active region. A base layer is formed adjacent at least a portion of the active region. A dielectric layer is formed adjacent at least a portion of the base layer, and then at least part of the dielectric layer is removed at an emitter contact location and at a sinker contact location. An emitter structure is formed at the emitter contact location. Forming the emitter structure includes etching the semiconductor device at the sinker contact location to form a sinker contact region. The sinker contact region has a first depth. The method may also include forming a gate structure. Forming the gate structure includes etching the sinker contact region thereby increasing the first depth of the sinker contact region to a second depth.

8 Claims, 2 Drawing Sheets

STRUCTURE OF SEMICONDUCTOR DEVICE WITH SINKER CONTACT REGION

RELATED APPLICATIONS

This is a divisional application of Ser. No. 10/262,211, filed Sep. 30, 2002 now U.S. Pat. No. 6,806,159. This application is related to application Ser. No. 10/262,206, entitled "Method for Manufacturing and Structure of Semiconductor Device with Shallow Trench Collector Contact Region," filed on Oct. 1, 2001, now U.S. Pat. No. 6,774,455.

TECHNICAL FIELD OF THE INVENTION

This invention relates generally to semiconductor devices and, more specifically, to a semiconductor device with a sinker contact region and a method of manufacturing the same.

BACKGROUND OF THE INVENTION

In complementary bipolar technologies for high-precision high speed analog and mixed-signal applications, a sinker contact is generally used to reduce the collector resistance. In a standard process integration sequence, collector sinkers are realized by using high-energy ion implantation of p-type or n-type dopants into the collector epitaxy. Dopant activation and diffusion are then realized by a thermal step (e.g., furnace or rapid thermal anneal). The diffusion penetrates into the collector epitaxial layer to electrically contact the underlying buried layer.

One or two lithographic steps are necessary to selectively introduce dopants into the collector epitaxy. Furthermore, high-energy high-dose ion implant capability is used for higher voltage applications in which thick collector epitaxy is used to guarantee high breakdown characteristics.

SUMMARY OF THE INVENTION

The present invention provides a semiconductor device and method for manufacturing the same that substantially eliminates or reduces at least some of the disadvantages and problems associated with previously developed semiconductor devices and methods for manufacturing the same.

In accordance with a particular embodiment of the present invention, a method for manufacturing a semiconductor device includes forming a buried layer of a semiconductor substrate. An active region is formed adjacent at least a portion of the buried layer. A first isolation structure is formed adjacent at least a portion of the buried layer. A second isolation structure is formed adjacent at least a portion of the active region. A base layer is formed adjacent at least a portion of the active region. A dielectric layer is formed adjacent at least a portion of the base layer, and then at least part of the dielectric layer is removed at an emitter contact location and at a sinker contact location. An emitter structure is formed at the emitter contact location. Forming the emitter structure includes etching the semiconductor device at the sinker contact location to form a sinker contact region. The sinker contact region has a first depth. The method may also include forming a gate structure. Forming the gate structure includes etching the sinker contact region thereby increasing the first depth of the sinker contact region to a second depth.

In accordance with another embodiment, a semiconductor device includes a buried layer of a semiconductor substrate and an active region adjacent at least a portion of the buried layer. A first isolation structure is adjacent at least a portion of the buried layer, and a second isolation structure is adjacent at least a portion of the active region. A base layer is adjacent at least a portion of the active region, and a dielectric portion is adjacent at least a portion of the base layer. The semiconductor device includes an emitter structure adjacent at least a portion of the base layer and a sinker contact region of the semiconductor substrate. The sinker contact region is formed adjacent at least a portion of the second isolation structure when the emitter structure is formed. The sinker contact region may have a depth of approximately 0.3 to 0.6 microns.

Technical advantages of particular embodiments of the present invention include a method of manufacturing a semiconductor device with a sinker contact region that requires less lithographic steps to complete the manufacturing process since the sinker contact region is formed when the dielectric layer is defined. Accordingly, the total time it takes to manufacture the semiconductor device and the labor resources required are reduced.

Another technical advantage of particular embodiments of the preset invention includes a method of manufacturing a semiconductor device with a sinker contact region that does not require high energy ion implantation to make the electrical contact between a collector contact and the buried layer since the collector contact can be formed within the sinker contact region. This can reduce the amount of time it takes to manufacture semiconductor device. It can also decrease the potential for contamination of critical devices or structures since the use of high energy implants can lead to such contamination during the manufacturing process.

Other technical advantages will be readily apparent to one skilled in the art from the following figures, descriptions and claims. Moreover, while specific advantages have been. enumerated above, various embodiments may include all, some or none of the enumerated advantages.

BRIEF DESCRIPTION OF THE DRAWINGS

For a more complete understanding of the particular embodiments of the invention and their advantages, reference is now made to the following descriptions, taken in conjunction with the accompanying drawings, in which.

DETAILED DESCRIPTION OF THE INVENTION

Figure 1:
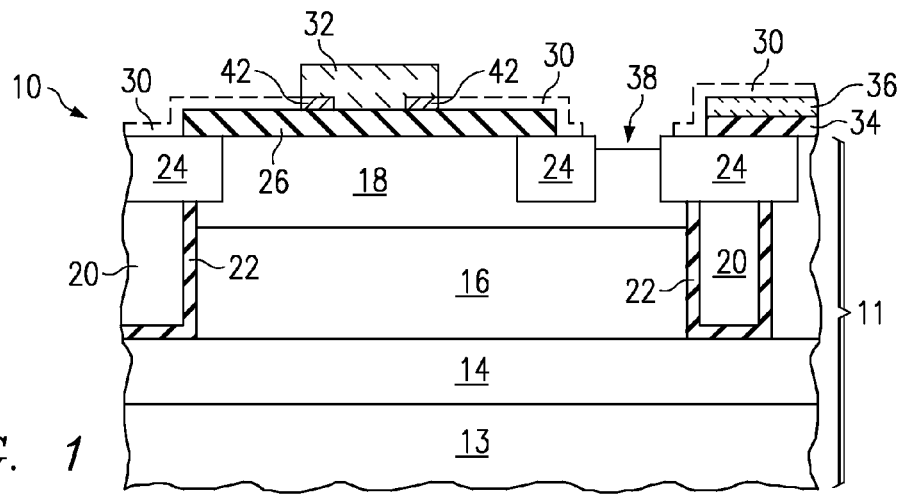
FIG. 1 is a cross-sectional diagram illustrating a semiconductor device with sinker contact region 38 at one stage of a manufacturing process, in accordance with a particular embodiment of the present invention.

FIG. 1 illustrates a semiconductor device 10 at one stage of a manufacturing process, in accordance with an embodiment of the present invention. Semiconductor device 10 includes a sinker contact region 38 formed using methods of the present invention. Sinker contact region 38 provides an area for a collector contact to be subsequently formed. Sinker contact region 38 is formed when portions of a dielectric layer 30 are removed, leaving dielectric portions 42. Since there is no dielectric layer 30 over sinker contact region 38, the etching process used to remove portions of dielectric layer 30 creates sinker contact region 38 in semiconductor substrate 11. Subsequently forming a collector contact within sinker contact region 38 will facilitate an electrical contact between the collector contact and a buried layer 16 of semiconductor substrate 11. Such electrical contact allows for the flow of an electrical current between the collector contact and buried layer 16.

Forming sinker contact region 38 in this manner requires less. lithographic steps to complete the process since the region is formed when dielectric portions 42 are defined. Furthermore, high energy ion implantation is not required for a collector contact to electrically contact the buried layer since the collector contact can be formed within sinker contact region 38. This can reduce the amount of time it takes to manufacture semiconductor device 10. It can also decrease the potential for contamination of critical devices or structures since the use of high energy implants can lead to such contamination during the manufacturing process.

Semiconductor device 10 includes semiconductor substrate 11 which comprises a wafer 13. As discussed in greater detail below, in this embodiment semiconductor substrate 11 also includes an oxide layer 14 and buried layer 16. An active region 18 is disposed adjacent at least a portion of buried layer 16. Deep trench isolation structures 20 are also adjacent at least a portion of buried layer 16 and include a liner oxide 22. Shallow trench isolation structures 24 are adjacent at least a portion of active region 18.

A base layer 26 is disposed adjacent at least a portion of semiconductor substrate 11. Emitter structure 35 is disposed adjacent at least a portion of base layer 26. A first gate stack layer 34 is also disposed adjacent at least a portion of semiconductor substrate 11, and a second gate stack layer 36 is disposed adjacent at least a portion of first gate stack layer 34.

Figure 2:
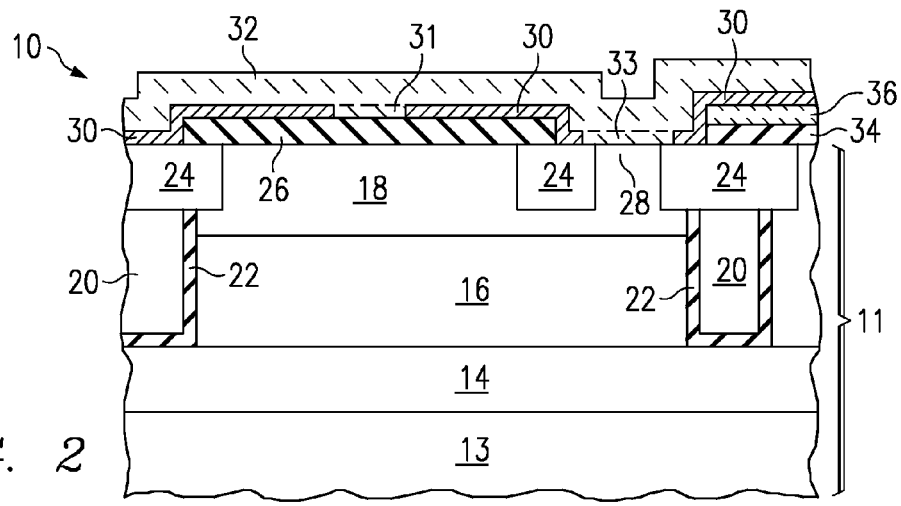
FIG. 2 is a cross-sectional diagram illustrating a semiconductor device with an active region and a buried layer at one stage of a manufacturing process, in accordance with a particular embodiment of the present invention.

FIG. 2 illustrates a particular stage during the manufacturing process of semiconductor device 10 of FIG. 1. Semiconductor substrate 11 comprises wafer 13, which is formed from a single crystalline silicon material. Semiconductor substrate 11 may comprise other suitable materials or layers without departing from the scope of the present invention. For example, semiconductor substrate 11 may Include a recrystallized semiconductor material, a polycrystalline semiconductor material or any other suitable semiconductor material.

Semiconductor device 10 includes an oxide layer 14. Oxide layer 14 may be formed by any of a variety of techniques well known to those skilled in the art and may comprise any suitable oxide. Other embodiments of the present invention may not include an oxide layer.

Buried layer 16 is formed within semiconductor substrate 11 using any of a variety of techniques well known to those of ordinary skill in the art. Buried layer 16 may either be negatively-doped to form a negative buried layer ("NBL") or positively-doped to form a positive buried layer ("PBL").

In an NBL, electrons conduct electricity during operation of semiconductor device 10, while holes conduct electricity in a PBL. Any of a number of dopants may be used to form an NBL, such as arsenic, phosphorus or antimony; and dopants such as boron or indium may be used to form a PBL.

Semiconductor device 10 includes first gate stack layer 34, which is defined to form a gate stack later in the manufacturing process. In the illustrated embodiment, first gate stack layer 34 comprises a polysilicon layer. First gate stack layer 34 may be formed by an of a variety of methods well known to those of ordinary skill in the art. Other embodiments of the present invention may not include a first gate stack layer 34.

Active region 18 is formed adjacent at least a portion of buried layer 16. Active region 18 is a substantially undoped or lightly doped region. Active region 18 may contain some diffusion of atoms from buried layer 16 migrating upward. Active region 18 may be formed by any of a variety of techniques well known to those of ordinary skill in the art, such as epitaxial growth.

In the illustrated embodiment, deep trench isolation structures 20 are formed adjacent at least a portion of buried layer 16. Deep trench isolation structures 20 provide isolation between elements of semiconductor device 10 during use of semiconductor device 10. Other embodiments of the present invention may or may not include deep trench isolation structures 20 or may provide isolation between elements of a semiconductor device in other ways, such as through diffusion.

Deep trench isolation structures 20 may be formed using photoresist and etching, or by any other means known to those of ordinary skill in the art. Deep trench isolation structures 20 may be filled with a semiconductive material such as intrinsic polycrystalline silicon or an insulative material such as silicon dioxide. Such material may be deposited within deep trench isolation structures 20 using a suitable deposition process such as chemical vapor deposition. In the illustrated embodiment, deep trench isolation structures 20 also include a liner oxide 22.

Shallow trench isolation structures 24 are formed adjacent at least a portion of active region 18. Shallow trench isolation structures 24 provide isolation between active regions of semiconductor device 10. Other embodiments of the present invention may or may not include shallow trench isolation structures 24 or may provide isolation between active regions of a semiconductor device through other ways, such as local oxidation of silicon, or LOCOS.

Shallow trench isolation structures 24 may be formed using photoresist and etching, or by any other means known to those of ordinary skill in the art. Shallow trench isolation structures 24 may be filled with a suitable insulative material such as silicon dioxide. Such material may be deposited within shallow trench isolation structures 24 using a suitable deposition process such as chemical vapor deposition. Shallow trench isolation structures 24 may have a depth of approximately 3,000 to 10,000 angstroms.

Base layer 26 is formed adjacent at least a portion of semiconductor substrate 11. Base layer 26 may comprise an in-situ doped or implanted silicon germanium or any other suitable material containing silicon, such as silicon germanium carbon or silicon itself. Base layer 26 may be formed by any of a variety of techniques well known to those of ordinary skill in the art and may have a thickness of approximately 190 nanometers.

Second gate stack layer 36 of semiconductor device 10 is formed. Second gate stack layer 34 is defined along with first gate stack layer 34 to form a gate stack later in the manufacturing process. In the illustrated embodiment, second gate stack layer 34 comprises a polysilicon layer. Second gate stack layer 34 may be formed by an of a variety of methods well known to those of ordinary skill in the art. Other embodiments of the present invention may not have a second gate stack layer 36.

Dielectric layer 30 is formed adjacent at least a portion of base layer 36. Dielectric layer 30 may comprise an appropriate dielectric, such as a suitable nitride or oxide. Dielectric layer 30 may be formed by any of a variety of techniques well known to those of ordinary skill in the art.

Dielectric layer 30 may originally have a portion 31 disposed above an area where an emitter structure will be formed and a portion 33 disposed above an area 28 which will become a sinker contact region. However, portions 31 and 33 are removed using a lithography and etching process or any another suitable process known to those of ordinary skill in the art.

The location of portion 33 partially overlaps shallow trench isolation structures 24 so that when a sinker contact region is formed it will be self-aligned with area 28 between shallow trench isolation structures 24. Ion implantation may be used at this stage to define a selectively implanted collector.

After a clean up process, an emitter layer 32 is disposed at least partially upon dielectric layer 30. In the illustrated embodiment, emitter layer 32 comprises a polysilicon material, but other embodiments may include an amorphous emitter layer. Emitter layer 32 may be formed by any of a variety of techniques well known to those of ordinary skill in the art.

Dopants are selectively implanted to provide a high concentration dopant source for emitter diffusion. An ultra-shallow emitter base metallurgic junction can be achieved by diffusing the implanted dopant with a rapid thermal process.

Figure 3:
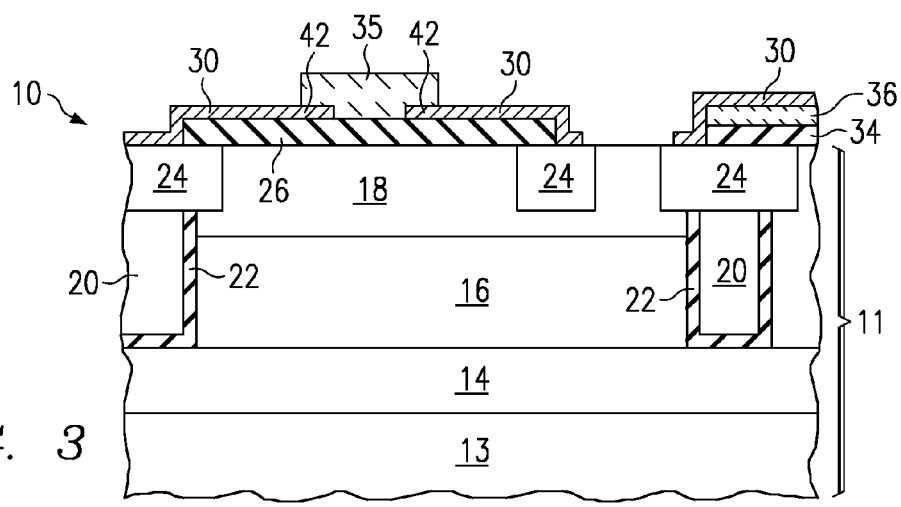
FIG. 3 is a cross-sectional diagram illustrating the semiconductor device of FIG. 2 at another stage of a manufacturing process showing an emitter structure, in accordance with a particular embodiment of the present invention.

FIG. 3 illustrates semiconductor device 10 of FIG. 2 at a further stage in the manufacturing process. Emitter layer 32 of FIG. 2 is subjected to a lithographic step and etching process to define and form emitter structure 35. Other processes well known to those of ordinary skill in the art may be used to remove portions of emitter layer 32 to form emitter structure 35. Dielectric portions 42 of dielectric layer 33 are under emitter structure 35.

Referring back to FIG. 1, semiconductor device 10 of FIG. 3 is illustrated at a further stage in the manufacturing process. Portions of dielectric layer 30 are removed, leaving dielectric portions 42 under emitter structure 35. Such removal is completed by subjecting dielectric layer 30 to a lithographic step and etching process. Using such a process, sinker contact region 38 is formed within semiconductor substrate 11 since there is no dielectric layer 30 to etch directly above the area where sinker contact region 38 is formed. Sinker contact region 38 provides a location where a collector contact can be formed later in the manufacturing process. In this embodiment, sinker contact region 38 has a depth of approximately 0.1 microns, but other embodiments may include a sinker contact region having other depths.

Forming sinker contact region 38 in this manner provides several technical advantages. Less lithographic steps may be needed to complete the process since the region is formed when removing portions of dielectric 30. Furthermore, high energy ion implantation may not be required for a subsequently-formed collector contact to electrically contact buried layer 16 since the collector contact can be formed within sinker contact region 38.

Figure 4:
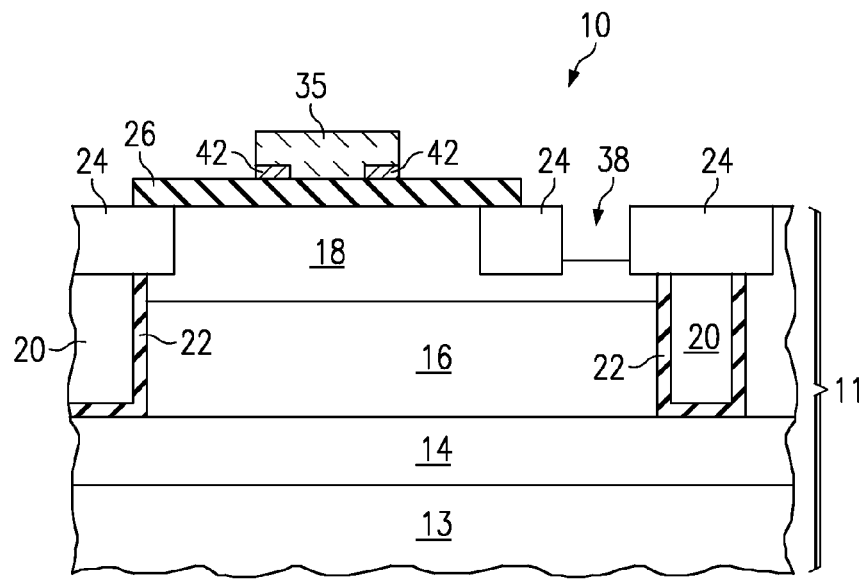
FIG. 4 is a cross-sectional diagram illustrating the semiconductor device of FIG. 1 at another stage of a manufacturing process showing a sinker contact region, in accordance with a particular embodiment of the present invention.

FIG. 4 illustrates semiconductor device 10 of FIG. 1 at a further stage in the manufacturing process, in accordance with another embodiment of the present invention. The illustrated portions of first gate stack layer 34 and second gate stack layer 36 of FIG. 3 have been removed to define a gate stack. Such removal can be achieved through a lithographic step and etching process.

Such an etching process increases the depth of sinker contact region 38 providing a deeper contact region for the formation of the collector contacts. In this embodiment, sinker contact region 38 has a suitable depth, such as approximately 0.3 to 0.6 microns. This will enable the collector contacts to be formed closer to buried layer 16, reducing the need for ion implantation steps or other methods to facilitate the connection between the collector contacts and buried layer 16.

Figure 5:
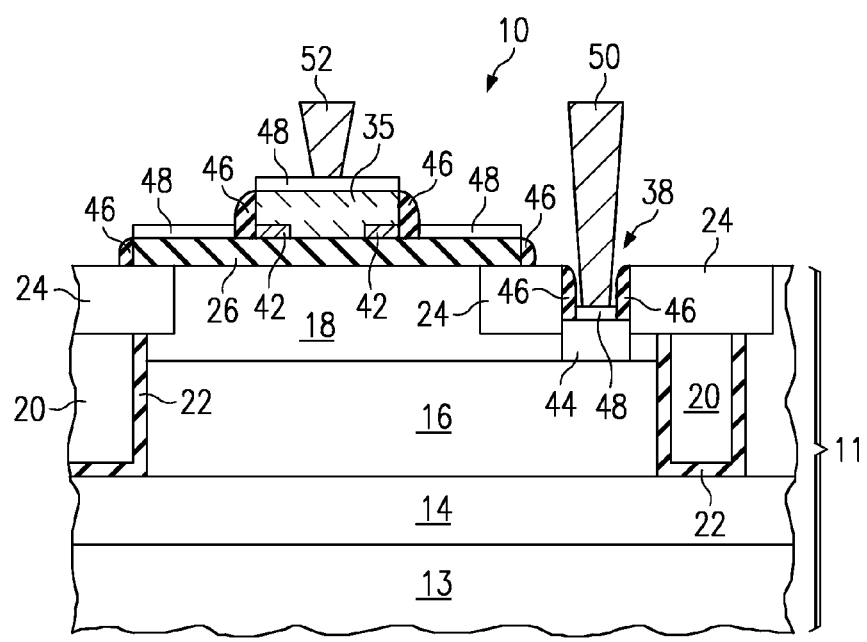
FIG. 5 is a cross-sectional diagram illustrating the semiconductor device of FIG. 4 at another stage of a manufacturing process showing a collector contact and an emitter contact, in accordance with a particular embodiment of the present invention.

FIG. 5 illustrates semiconductor device 10 of FIG. 4 at a further stage in the manufacturing process, in accordance with another embodiment of the present invention. FIG. 5 includes collector contact 50 formed within sinker contact region 38. Collector contact 50 may electrically contact buried layer 16. Suicide layers 48 are formed, and source/drain implant 44 is made to facilitate the electrical connection between collector contact 50 and buried layer 16. Emitter contact 52 is formed adjacent suicide layer 48 proximate emitter structure 35. Spacers 46 are formed on semiconductor device 10 as well, using any of a variety of techniques known to those of ordinary skill in the art.

Standard processing steps are undertaken to complete the manufacture of semiconductor device 10. Appropriate metal interconnections are formed and passivation is undertaken. Source/drain or extrinsic base ion implants and diffusion may be performed to further complete the connection with buried layer 16. Other appropriate methods or steps may be performed to complete the manufacture of semiconductor device 10.

The illustrated embodiments incorporate embodiments of the invention in a bipolar complementary metal oxide semiconductor (BiCMOS) technology. Particular embodiments of the present invention may be incorporated into complementary metal oxide semiconductor (CMOS) and complementary bipolar complementary metal oxide semiconductor (CBiCMOS) technologies as well. Other technologies well known to those of ordinary skill in the art may utilize particular embodiments of the present invention as well.

Although particular configurations and methods have been illustrated for semiconductor device 10, other embodiments of the present invention may include other configurations and/or methods. For example, other embodiments may utilize a highly selective overetch at the removal of the emitter layer. This might require a highly selective silicon/nitride or silicon/oxide etch but has the advantage of allowing the depth of the sinker contact region to be customized to the requirements and specifications of the particular technology being developed.

Although the present invention has been described in detail, various changes and modifications may be suggested to one skilled in the art. It is intended that the present invention encompass such changes and modifications as falling within the scope of the appended claims.

What is claimed is:
1. A semiconductor device, comprising:
a buried layer of a semiconductor substrate;
an active region adjacent at least a portion of the buried layer,
a base layer adjacent at least a portion of the active region;

a dielectric portion adjacent at least a portion of the base layer;

an emitter structure adjacent at least a portion of the base layer;

a sinker contact region of the semiconductor substrate, the sinker contact region formed adjacent at least a portion of the active region when the emitter structure is formed; and wherein the sinker contact region has a depth of approximately 0.1 to 0.2 microns or approximately 0.3 to 0.6 microns.

2. The semiconductor device of claim 1, further comprising a collector contact formed at the sinker contact region, the collector contact operable to electrically contact the buried layer.

3. The semiconductor device of claim 1, further comprising an oxide layer adjacent at least a portion of the buried layer.

4. The semiconductor device of claim 1, further comprising a first isolation structure adjacent at least a portion of the buried layer.

5. The semiconductor device of claim 4, further comprising a second isolation structure adjacent at least a portion of the active region.

6. The semiconductor device of claim 4, wherein the first isolation structure comprises a deep trench.

7. The semiconductor device of claim 4, further comprising a liner oxide adjacent at least a portion of the first isolation structure.

8. The semiconductor device of claim 5, wherein the second isolation structure comprises a shallow trench.

* * * * *